United States Patent
Matyushkin et al.

(10) Patent No.: US 12,237,201 B2
(45) Date of Patent: Feb. 25, 2025

(54) ELECTROSTATIC CHUCKS WITH COOLANT GAS ZONES AND CORRESPONDING GROOVE AND MONOPOLAR ELECTROSTATIC CLAMPING ELECTRODE PATTERNS

(71) Applicant: Lam Research Corporation, Fremont, CA (US)

(72) Inventors: Alexander Matyushkin, San Jose, CA (US); Keith Comendant, Fremont, CA (US); John Patrick Holland, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/610,138

(22) Filed: Mar. 19, 2024

(65) Prior Publication Data

US 2024/0347366 A1    Oct. 17, 2024

Related U.S. Application Data

(63) Continuation of application No. 18/139,660, filed on Apr. 26, 2023, now Pat. No. 11,942,351, which is a
(Continued)

(51) Int. Cl.
| | | |
|---|---|---|
| H01L 21/683 | (2006.01) | |
| H01J 37/32 | (2006.01) | |
| H01L 21/67 | (2006.01) | |

(52) U.S. Cl.
CPC .... *H01L 21/6833* (2013.01); *H01J 37/32724* (2013.01); *H01L 21/67109* (2013.01);
(Continued)

(58) Field of Classification Search
CPC .......... H01L 21/67109; H01L 21/6831; H01L 21/6833; H01J 37/32724; H01J 2237/002; H01J 2237/2007
(Continued)

(56) References Cited

U.S. PATENT DOCUMENTS

| | | | |
|---|---|---|---|
| 5,631,803 A | | 5/1997 | Cameron et al. |
| 5,801,915 A | * | 9/1998 | Kholodenko ....... C23C 16/4586 |
| | | | 279/128 |

(Continued)

FOREIGN PATENT DOCUMENTS

| | | |
|---|---|---|
| CN | 101409251 A | 4/2009 |
| JP | H07273176 A | 10/1995 |

(Continued)

OTHER PUBLICATIONS

Allowance issued in Corresponding Japanese Patent App. No. 2023022054 dated May 15, 2024.
(Continued)

*Primary Examiner* — Kevin J Comber

(57) ABSTRACT

An electrostatic chuck for a substrate processing system is provided and includes a baseplate, an intermediate layer disposed on the baseplate, and a top plate. The top plate is bonded to the baseplate via the intermediate layer and is configured to electrostatically clamp to a substrate. The top plate includes a monopolar clamping electrode and seals. The monopolar clamping electrode includes a groove opening pattern with coolant gas groove opening sets. The seals separate coolant gas zones. The coolant gas zones include four or more coolant gas zones. Each of the coolant gas zones includes distinct coolant gas groove sets. The top plate includes the distinct coolant gas groove sets. Each of the distinct coolant gas groove sets has one or more coolant gas
(Continued)

supply holes and corresponds to a respective one of the coolant gas groove opening sets.

22 Claims, 9 Drawing Sheets

Related U.S. Application Data continuation of application No. 16/969,260, filed as application No. PCT/US2018/026299 on Apr. 5, 2018, now Pat. No. 11,664,262.

(52) U.S. Cl.
CPC .... *H01L 21/6831* (2013.01); *H01J 2237/002* (2013.01); *H01J 2237/2007* (2013.01)

(58) Field of Classification Search
USPC ........................................................ 361/234
See application file for complete search history.

(56) References Cited

U.S. PATENT DOCUMENTS

| | | | |
|---|---|---|---|
| 9,209,061 | B2 | 12/2015 | Hayahara et al. |
| 2009/0114158 | A1* | 5/2009 | Zucker .................... H01L 21/68 392/416 |
| 2014/0301010 | A1 | 10/2014 | Hayahara et al. |
| 2014/0356985 | A1 | 12/2014 | Ricci et al. |
| 2015/0214013 | A1* | 7/2015 | Glukhoy ........... H01J 37/32477 29/527.1 |
| 2015/0340255 | A1* | 11/2015 | Parkhe .............. H01L 21/67248 165/80.5 |
| 2015/0364354 | A1* | 12/2015 | Tantiwong .......... H01J 37/3244 156/345.34 |
| 2016/0111315 | A1 | 4/2016 | Parkhe |
| 2017/0032989 | A1 | 2/2017 | Chang |

FOREIGN PATENT DOCUMENTS

| | | | |
|---|---|---|---|
| JP | H0922936 | A | 1/1997 |
| JP | 200579415 | A | 3/2005 |
| JP | 2005136104 | A | 5/2005 |
| JP | 200613256 | A | 1/2006 |
| JP | 2007109770 | A | 4/2007 |
| JP | 2009158917 | A | 7/2009 |
| JP | 2010141081 | A | 6/2010 |
| JP | 2011114178 | A | 6/2011 |
| JP | 2011222977 | A | 11/2011 |
| JP | 2013021151 | A | 1/2013 |
| JP | 201588743 | A | 5/2015 |
| KR | 20100108323 | A | 10/2010 |
| KR | 20140068955 | A | 6/2014 |
| TW | 200915467 | A | 4/2009 |
| TW | 200919624 | A | 5/2009 |
| WO | WO-2014164449 | A1 | 10/2014 |

OTHER PUBLICATIONS

International Search Report and Written Opinion of the ISA issued in PCT/US2018/026299, mailed Jan. 4, 2019; ISA/KR.

Office Action issued in corresponding Japanese Patent Application No. 2019-534967 on Aug. 11, 2020 (5 pages).

Office Action issued in corresponding Taiwan Patent Application No. 109120719 dated Jan. 25, 2021.

Office Action issued in corresponding Korean Patent Application No. 10-2020-7011104 dated Apr. 27, 2021 (7 pages).

Office Action issued in corresponding Korean Patent Application No. 10-2021-7042757 dated Mar. 24, 2022.

Office Action issued in corresponding Japanese Patent Application No. 2021-102828 dated Jul. 12, 2022.

Office Action issued in corresponding Taiwanese Patent Application No. 110143702 dated Sep. 29, 2022.

* cited by examiner

ELECTROSTATIC CHUCKS WITH COOLANT GAS ZONES AND CORRESPONDING GROOVE AND MONOPOLAR ELECTROSTATIC CLAMPING ELECTRODE PATTERNS

CROSS-REFERENCE TO RELATED APPLICATIONS

This application is a continuation of U.S. patent application Ser. No. 16/969,260, filed Aug. 12, 2020, which is a National Stage application of International Application No. PCT/US2018/026299, filed on Apr. 5, 2018. The entire disclosures of each of the applications referenced above are incorporated herein by reference.

FIELD

The present disclosure relates to electrostatic chucks of substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Example processes that may be performed on a substrate include, but are not limited to, a plasma enhanced chemical vapor deposition (PECVD) process, a physical vapor deposition (PVD) process, an ion implantation process, and/or other etch, deposition, and cleaning processes. As an example, during an etching process, a substrate may be arranged on an electrostatic chuck (ESC) in a substrate processing system and a thin film on the substrate is etched.

SUMMARY

An electrostatic chuck for a substrate processing system is provided and includes a baseplate, an intermediate layer disposed on the baseplate, and a top plate. The top plate is bonded to the baseplate via the intermediate layer and is configured to electrostatically clamp to a substrate. The top plate includes a monopolar clamping electrode and seals. The monopolar clamping electrode includes a groove opening pattern with coolant gas groove opening sets. The seals separate coolant gas zones. The coolant gas zones include four or more coolant gas zones. Each of the coolant gas zones includes distinct coolant gas groove sets. The top plate includes the distinct coolant gas groove sets. Each of the distinct coolant gas groove sets has one or more coolant gas supply holes and corresponds to a respective one of the coolant gas groove opening sets.

In other features, the coolant gas groove opening sets are disposed in one or more layers of the top plate and on a layer of the monopolar clamping electrode. In other features, the coolant gas groove opening sets are disposed respectively below the distinct coolant gas groove sets. In other features, each of the coolant gas groove sets includes coolant gas grooves for distributing coolant gas across a top of the top plate.

In other features, each of the distinct coolant gas groove sets in an outermost one of the coolant gas zones includes grooves and supply holes arranged as an annular series of elements. Each of the distinct coolant gas groove sets in three or more innermost ones of the coolant gas zones includes a radially extending groove and annularly extending grooves.

In other features, the annularly extending grooves of each of the distinct coolant gas groove sets extend from and away from the corresponding one of the radially extending grooves. In other features, the groove opening pattern is similar to an arranged pattern of the distinct coolant gas groove sets. In other features, there are a same number of coolant gas openings in the groove opening pattern as there are distinct coolant gas groove sets in the top plate.

In other features, one of the coolant gas zones includes a first coolant gas groove set and a second coolant gas groove set. The first coolant gas groove set includes a first radially extending groove and first grooves extending from the first radially extending groove. The second coolant gas groove set includes a second radially extending groove and second grooves extending from the second radially extending groove. The distinct coolant gas groove sets include the first coolant gas groove set and the second coolant gas groove set. In other features, the first grooves include first branch pairs. The second grooves include second branch pairs. The first branch pairs extend along same circular paths as the second branch pairs and are separated by the second branch pairs by gaps. The gaps are disposed between the first branch pairs and the second branch pairs.

In other features, the distinct coolant gas groove sets include a first coolant gas groove set disposed in a first coolant gas zone and a second coolant gas groove set disposed in a second coolant gas zone. The first coolant gas groove set is radially aligned with the second coolant gas groove set, such that the first coolant gas groove set and the second coolant gas groove set are centered on a same radially extending line extending from a center of the top plate.

In other features, the distinct coolant gas groove sets include a first coolant gas groove set disposed in a first coolant gas zone and a second coolant gas groove set disposed in a second coolant gas zone. The first coolant gas groove set is disposed radially outward and annularly offset from the second coolant gas groove set.

In other features, the coolant gas groove opening sets include a first coolant gas groove opening set disposed below a first coolant gas zone and a second coolant gas groove opening set disposed below a second coolant gas zone. The first coolant gas groove opening set is radially aligned with the second coolant gas groove opening set, such that the first coolant gas groove set and the second coolant gas groove set are centered on a same radially extending line extending from a center of the top plate.

In other features, the coolant gas groove opening sets include: a first coolant gas groove opening set disposed below a first coolant gas zone; and a second coolant gas groove opening set disposed below a second coolant gas zone. The first coolant gas groove opening set is disposed radially outward and annularly offset from the second coolant gas groove opening set. In other features, the coolant gas zones are concentric. In other features, the monopolar clamping electrode covers at least 95% of a radial surface area of the top plate.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
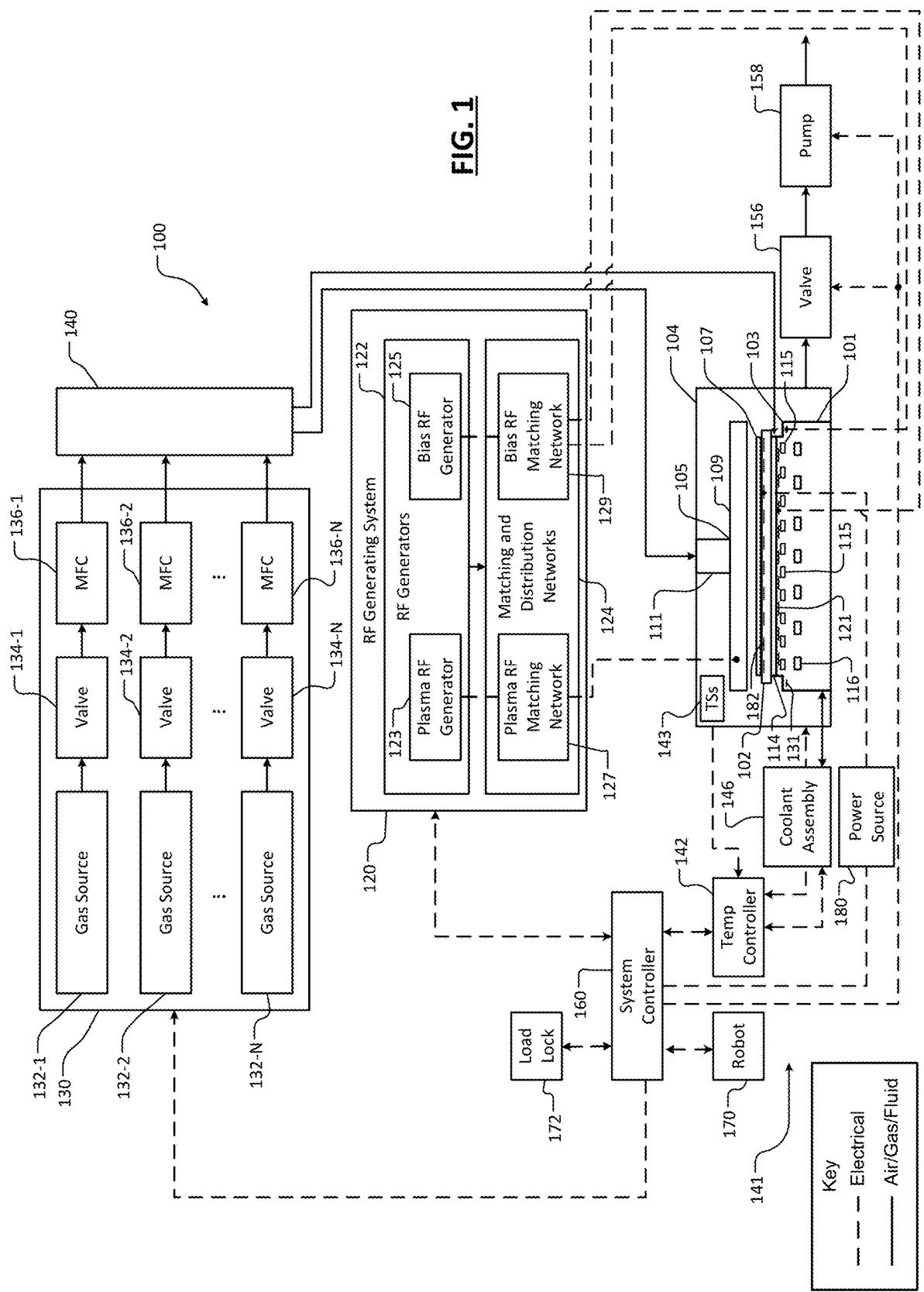
FIG. 1 is a functional block diagram of an example of a substrate processing system incorporating an ESC in accordance with an embodiment of the present disclosure.

An ESC holds a substrate during processing of the substrate. The ESC holds the substrate in place using electrostatic force in, for example, a vacuum processing chamber. The ESC may have a two-plate arrangement including a thin top plate (e.g., 1.25 millimeters (mm) thick) formed of a dielectric material (e.g., ceramic) and a bulk (or thick) baseplate. The top plate may include seals, mesas, coolant grooves and an electrode. The seals separate coolant zones between top surfaces of the ESC and the substrate. The substrate is disposed on the seals and the mesas during processing and is held down to the ESC by electrostatic force via the electrode, which electrostatically clamps the substrate on the ESC.

Thermal contact between the substrate and the top plate of the ESC is needed in order to modulate a temperature of the substrate during processing. This is true regardless of whether the process being performed includes sinking heat from or sourcing heat into the substrate. A coolant gas (e.g., helium gas) may be contained (i) between contact surfaces of the substrate and the top plate, and (ii) between the seals of the top plate. The seals are disposed between the substrate and the top plate and are an integral part of the top plate. The sealed zones are formed when the substrate is electrostatically clamped on the top plate. The sealed zones are disposed radially between the seals and vertically between the top surface of the top plate and a bottom opposing surface (or backside) of the substrate. Coolant gas leakage may occur between the sealed zones and/or between a radially outermost sealed zone and an interior of the vacuum processing chamber.

An amount of coolant gas pressure that may be provided in the sealed zones without an excessive amount of gas leakage is limited by the electrostatic clamping force provided by the electrode and corresponding clamping system. The more clamping force provided to hold the substrate on the top plate of the ESC, the higher the coolant gas pressure that can be provided. Thus, there is a limit to the amount of coolant gas pressure that can be used to affect heat transfer between the substrate and the top plate.

Also, parameters such as a heat transfer rate, a pressure of coolant gas, and a distance between a substrate and a top plate of an ESC are related. For example, as the distance decreases, the heat transfer rate increases. However, decreasing the distance causes a decrease in an amount of lateral flow conductance, which can cause pressure non-uniformities between the substrate and the top plate. The resultant pressure changes can result in inadequate heat transfer (i) globally between the substrate and the ESC resulting in elevated substrate temperatures, and/or (ii) locally in areas across a top surface area of the ESC resulting in temperature non-uniformities. Supply and pressure of the coolant gas may be adjusted to provide adequate heat transfer. Coolant gas grooves may be incorporated to aid in uniformly distributing coolant gas to prevent the temperature non-uniformities.

Dielectric breakdown and subsequent arcing can occur between coolant gas grooves and electrostatic clamping electrodes if distances between the coolant gas grooves and the electrostatic clamping electrodes are less than a predetermined distance. For example, an ESC having a thin top plate and a clamping electrode disposed near a top surface of the top plate and near one or more coolant gas grooves can experience dielectric breakdown and arcing between the clamping electrode and the coolant gas grooves. Arcing can cause irreparable damage to an ESC and be a source of defects.

The examples set forth herein include ESCs with top plates having coolant gas groove patterns and corresponding clamping electrodes that uniformly distribute coolant gas while providing proper separation between coolant gas grooves and clamping electrodes. The coolant gas groove patterns include tree-patterned groove sets that are uniformly distributed across top surfaces of top plates to uniformly distribute coolant gas and properly cool backsides of substrates. The coolant gas grooves promote distribution of the coolant gas across the top plates. The clamping electrodes are monopolar electrodes, where each ESC includes a single non-segmented clamping electrode. The clamping electrodes cover more than a predetermined radial surface area of the ESCs and have respective groove opening patterns. By covering more than a predetermined amount (e.g., more than 95%) of a total top plate/substrate interface surface area, the clamping electrodes provide improved substrate clamping. Clamping force is proportional to surface area of an electrode. The groove opening patterns provide a predetermined amount of space between the clamping electrodes and the coolant gas grooves to prevent dielectric breakdown and arcing.

FIG. 1 shows a substrate processing system 100 incorporating an ESC 101. The ESC 101 may be configured the same or similarly as any of the ESCs disclosed herein. Although FIG. 1 shows a capacitive coupled plasma (CCP) system, the embodiments disclosed herein are applicable to transformer coupled plasma (TCP) systems, electron cyclotron resonance (ECR) plasma systems, inductively coupled plasma (ICP) systems and/or other systems and plasma sources that include a substrate support. The embodiments are applicable to PVD processes, PECVD processes, chemically enhanced plasma vapor deposition (CEPVD) processes, ion implantation processes, plasma etching processes, and/or other etch, deposition, and cleaning processes.

The ESC 101 includes a top plate 102 and a baseplate 103. Both of the plates 102, 103 may be formed of ceramic and/or other suitable materials. The plates 102, 103, other top plates and baseplates, and other features of the disclosed ESCs are further described below with respect to the examples shown in FIGS. 1-8. Although the ESCs of FIGS. 1-8 are each shown as having certain features and not other features, each of the ESCs may be modified to include any of the features disclosed herein and in FIGS. 1-8.

The substrate processing system 100 includes a processing chamber 104. The ESC 101 is enclosed within the processing chamber 104. The processing chamber 104 also encloses other components, such as an upper electrode 105, and contains RF plasma. During operation, a substrate 107 is arranged on and electrostatically clamped to the top plate 102 of the ESC 101. For example only, the upper electrode 105 may include a showerhead 109 that introduces and distributes gases. The showerhead 109 may include a stem portion 111 including one end connected to a top surface of the processing chamber 104. The showerhead 109 is generally cylindrical and extends radially outward from an opposite end of the stem portion 111 at a location that is spaced from the top surface of the processing chamber 104. A substrate-facing surface or the showerhead 109 includes holes through which process or purge gas flows. Alternately, the upper electrode 105 may include a conducting plate and the gases may be introduced in another manner. One or both of the plates 102, 103 may perform as a lower electrode.

An intermediate (or bond) layer 114 is arranged between the plates 102, 103. The intermediate layer 114 may bond the top plate 102 to the baseplate 103. As an example, the intermediate layer may be formed of an adhesive material suitable for bonding the top plate 102 to the baseplate 103. The baseplate 103 may include one or more gas channels 115 and/or one or more coolant channels 116 for flowing backside (or coolant) gas to a backside of the substrate 107 and coolant through the baseplate 103.

An RF generating system 120 generates and outputs RF voltages to the upper electrode 105 and lower electrodes (e.g., one or more electrodes 121 in the plate 103). One of the upper electrode 105 and the ESC 101 may be DC grounded, AC grounded or at a floating potential. For example only, the RF generating system 120 may include one or more RF generators 122 (e.g., a capacitive coupled plasma RF power generator, a bias RF power generator, and/or other RF power generator) that generate RF voltages, which are fed by one or more matching and distribution networks 124 to the upper electrode 105 and/or the ESC 101. As an example, a plasma RF generator 123, a bias RF generator 125, a plasma RF matching network 127 and a bias RF matching network 129 are shown. The plasma RF generator 123 may be a high-power RF generator producing, for example 6-10 kilo-watts (KW) of power or more. The bias RF matching network supplies power to RF electrodes, such as RF electrodes 121 in the plate 103.

A gas delivery system 130 includes one or more gas sources 132-1, 132-2, . . . , and 132-N (collectively gas sources 132), where N is an integer greater than zero. The gas sources 132 supply one or more precursors and gas mixtures thereof. The gas sources 132 may also supply etch gas, carrier gas and/or purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 104. For example only, the output of the manifold 140 is fed to the showerhead 109.

The substrate processing system 100 further includes a cooling system 141 that includes a temperature controller 142. Although shown separately from a system controller 160, the temperature controller 142 may be implemented as part of the system controller 160. One or more of the plates 102, 103 may include multiple temperature controlled zones.

The temperature controller 142 and/or the system controller 160 may control flow rate of backside gas (e.g., helium) to the gas channels 115 for cooling the substrate by controlling flow from one or more of the gas sources 132 to the gas channels 115. The temperature controller 142 may also communicate with a coolant assembly 146 to control flow of a first coolant (pressures and flow rates of a cooling fluid) through the channels 116. The first coolant assembly 146 may receive a cooling fluid from a reservoir (not shown). For example, the coolant assembly 146 may include a coolant pump and reservoir. The temperature controller 142 operates the coolant assembly 146 to flow the coolant through the channels 116 to cool the baseplate 103. The temperature controller 142 may control the rate at which the coolant flows and a temperature of the coolant. The temperature controller 142 controls pressure and flow rates of gas and/or coolant supplied to channels 115, 116 based on detected parameters from sensors 143 within the processing chamber 104. The temperature sensors 143 may include resistive temperature devices, thermocouples, digital temperature sensors, and/or other suitable temperature sensors. During an etch process, the substrate 107 may be heated up by a predetermined temperature (e.g., 120 degrees Celsius (° C.)) in presence of high-power plasma. Flow of gas and/or coolant through the channels 115, 116 reduces temperatures of the baseplate 103, which reduces temperatures of the substrate 107 (e.g., cooling from 120° C. to 80° C.).

A valve 156 and pump 158 may be used to evacuate reactants from the processing chamber 104. The system controller 160 may control components of the substrate processing system 100 including controlling supplied RF power levels, pressures and flow rates of supplied gases, RF matching, etc. The system controller 160 controls states of the valve 156 and the pump 158. A robot 170 may be used to deliver substrates onto, and remove substrates from, the ESC 101. For example, the robot 170 may transfer substrates between the ESC 101 and a load lock 172. The robot 170 may be controlled by the system controller 160. The system controller 160 may control operation of the load lock 172.

A power source 180 may provide power, including a high voltage) to a monopolar clamping electrode 182 to electrostatically clamp the substrate 107 to the top plate 102. The power source 180 may be controlled by the system controller 160. The valves, gas and/or coolant pumps, power sources, RF generators, etc. may be referred to as actuators. The gas channels, coolant channels, etc. may be referred to as temperature adjusting elements.

Figure 2:
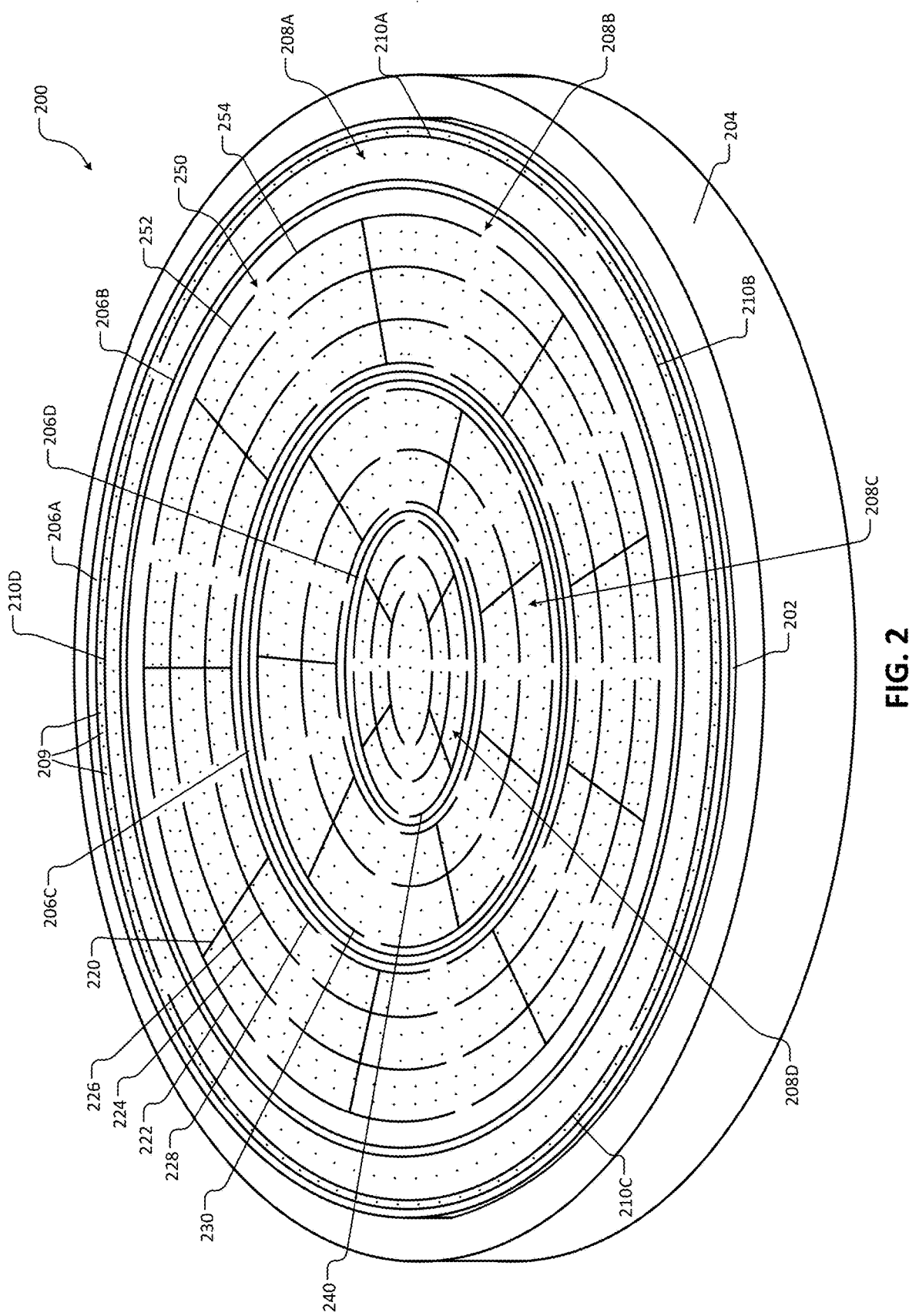
FIG. 2 is a perspective view of an example of an ESC incorporating four coolant gas zones with a coolant gas groove pattern having staggered groove sets and a corresponding clamping electrode pattern in accordance with an embodiment of the present disclosure.
Figure 4:
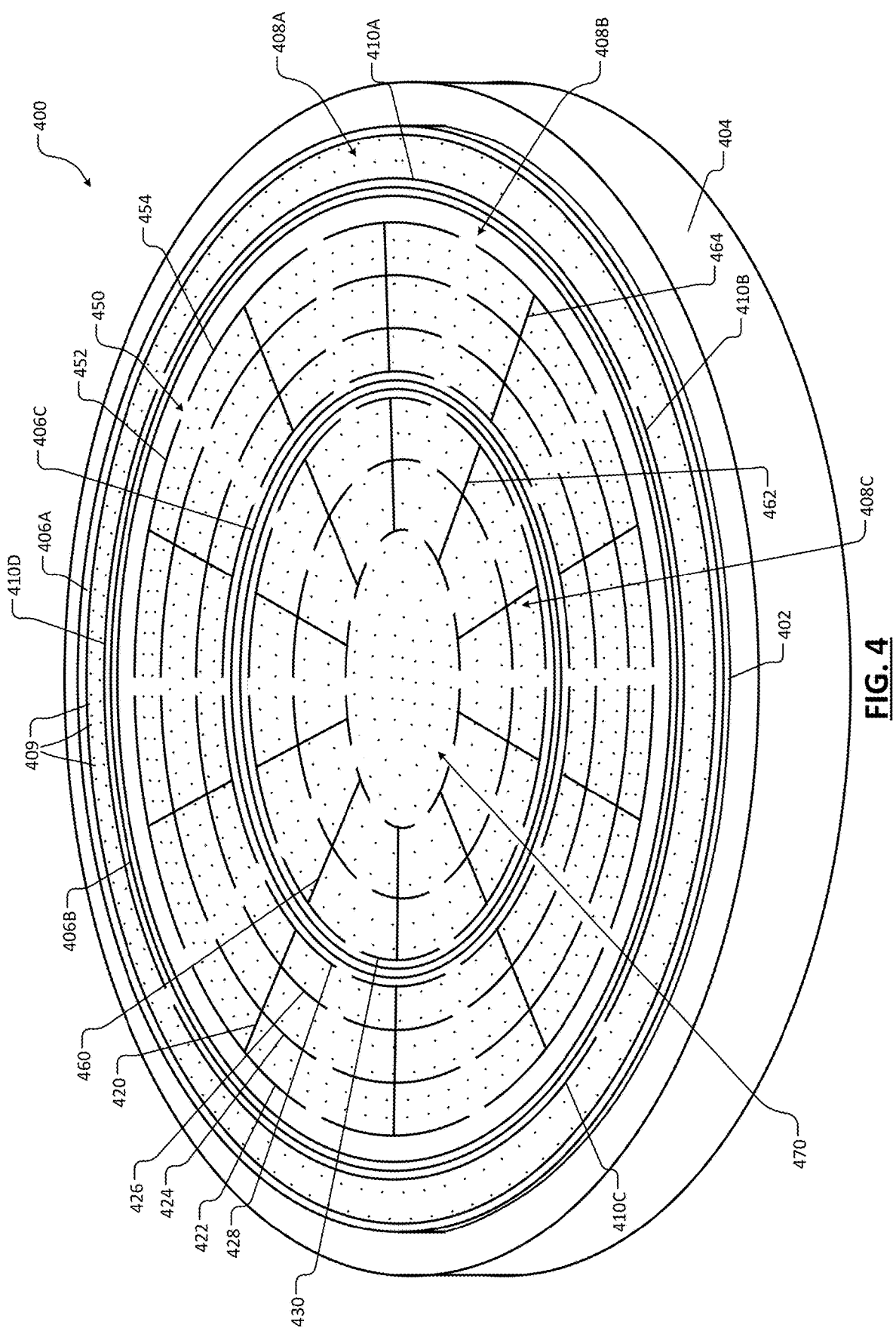
FIG. 4 is a perspective view of an example of another ESC incorporating three coolant gas zones with a coolant gas groove pattern having radially aligned groove sets and a corresponding clamping electrode pattern in accordance with an embodiment of the present disclosure.

FIG. 2 shows an ESC 200 that includes a top plate 202 and a base plate 204. The top plate 202 may be bonded to the baseplate 204 via an intermediate layer (an example of which is shown in FIG. 1). The top plate 202 includes seals 206A, 206B, 206C, 206D which separate (i) sealed (or gas coolant) zones 208A, 208B, 208C, 208D, and (ii) zone 208A from an interior of a processing chamber (e.g., the processing chamber 104 of FIG. 1). The zones 208 are concentric. Each of the sealed zones 208 includes mesas 209. The mesas 209 may be uniformly distributed across the top plate 202 and/or in predetermined patterns having predetermined dimensions. Although the ESC 200 is shown as having four coolant gas zones, the ESC 200 may have three or more coolant gas zones. An example, of an ESC having three zones is shown in FIG. 4. The seals 206 are annular-shaped and protrude upward from the top plate 202. The seals 206 may be formed of the same material as the top plate 202 and may be integrally formed as part of the top plate 202. The seals 206 may be concentric, as shown.

Figure 8:
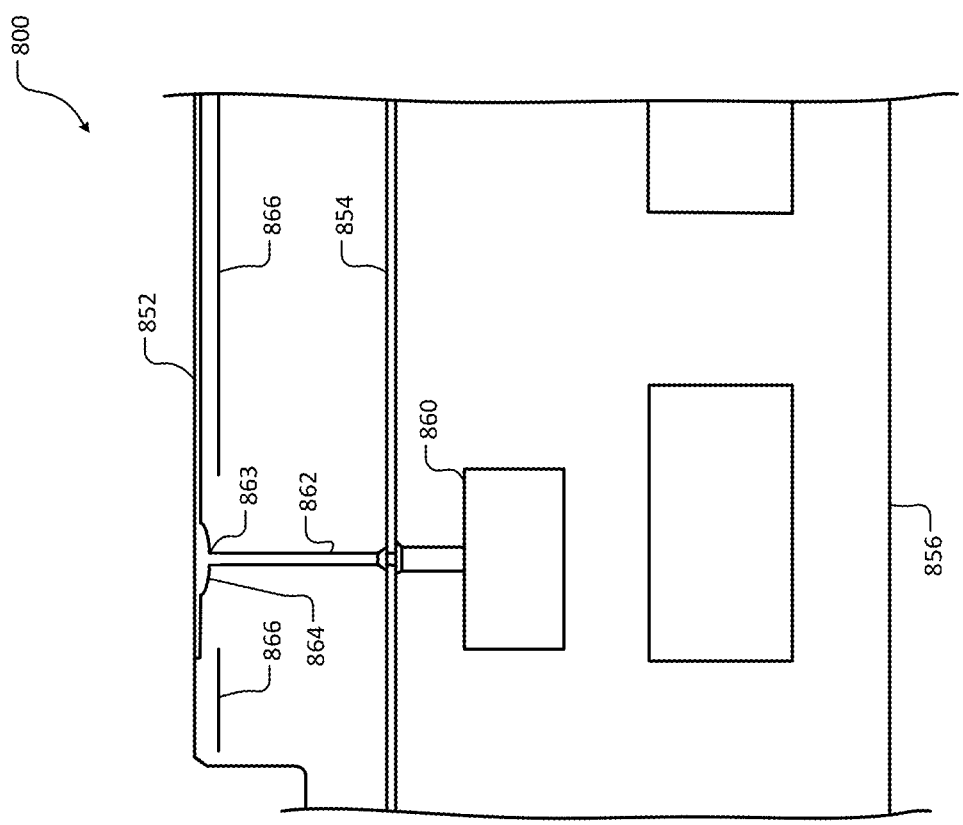
FIG. 8 is a cross-sectional view of an example of a portion of an ESC illustrating a coolant gas supply hole at a bottom of a coolant gas groove in accordance with an embodiment of the present disclosure.

The radially outer most sealed zone 208A includes coolant gas grooves 210A, 210B, 210C, 210D that are in series and extend along a same circle (or circular path). The coolant gas grooves 210 may collectively be referred to as a single segmented groove that is circular shaped and has multiple gaps. The single segmented groove may have any number of gaps and corresponding grooves. In one embodiment, the number of gaps in the single segmented groove is minimized for improved coolant gas distribution while maintaining distribution symmetry. The coolant gas grooves 210 may each have any number of coolant gas supply holes through which coolant gas (e.g., helium) is supplied to the coolant gas grooves 210. An example of a gas supply hole is shown in FIG. 8.

Each of the sealed zones 208 includes multiple coolant gas groove sets, where each coolant gas groove set is tree-shaped and includes a radially extending groove and multiple pairs of annularly extending grooves (referred to as branch pairs). Each coolant gas groove set may have any number of branch pairs. In the example shown, the sealed zone 208B includes 9 coolant gas groove sets, the sealed zone 208C includes 7 coolant gas groove sets, and the radially inner most sealed zone 208D includes 4 coolant gas groove sets. As an example, a radially extending groove 220 and branches 222, 224, 226, 228 are identified for one of the coolant gas groove sets of the sealed zone 208B. One of the coolant gas groove sets of each of the sealed zones 208C, 208D are designated respectively 230, 240. The branches, in each of the branch pairs, oppose each other and extend in opposite directions away from a corresponding intersection, where the branches meet the corresponding one of the radially extending grooves.

In FIG. 2, the grooves of the coolant gas groove sets are shown as lines. In actuality, the grooves are shallow trenches that direct and distribute coolant gas uniformly throughout the sealed zones 208. Each of the grooves has a corresponding maximum depth and a corresponding maximum width. As an example, each of the grooves may have a maximum depth of 100 micron (μ) and have a maximum width of 300μ. The grooves may have non-uniform depth and thus not have a rectangular-shaped cross section. As shown, the lengths of the branches of each of the coolant gas groove sets decrease along the corresponding radially extending groove, such that the radially outer most branches are the longest and the radially inner most branches are the shortest.

As an example, each of the coolant gas groove sets may have one or more corresponding coolant gas supply holes. Each of the coolant gas groove sets may have one or more corresponding coolant gas return holes. In an embodiment, the coolant gas groove sets include coolant gas supply holes and not coolant gas return holes. In another embodiment, the coolant gas groove sets include coolant gas supply holes and coolant gas return holes. In another embodiment, each of the coolant gas groove sets includes only a single coolant gas supply hole and only one coolant gas return hole. The coolant gas supply hole may be located in a groove intersection at a radially outermost end of the corresponding radially extending groove. Each groove intersection is where a radially extending groove meets inner most ends of two branches. The coolant gas return hole may be (i) at a radially innermost end of the radially extending groove, (ii) in a groove of the corresponding coolant gas groove set and at a furthest point away from the coolant gas supply hole, or (iii) at a point therebetween.

Figure 5:
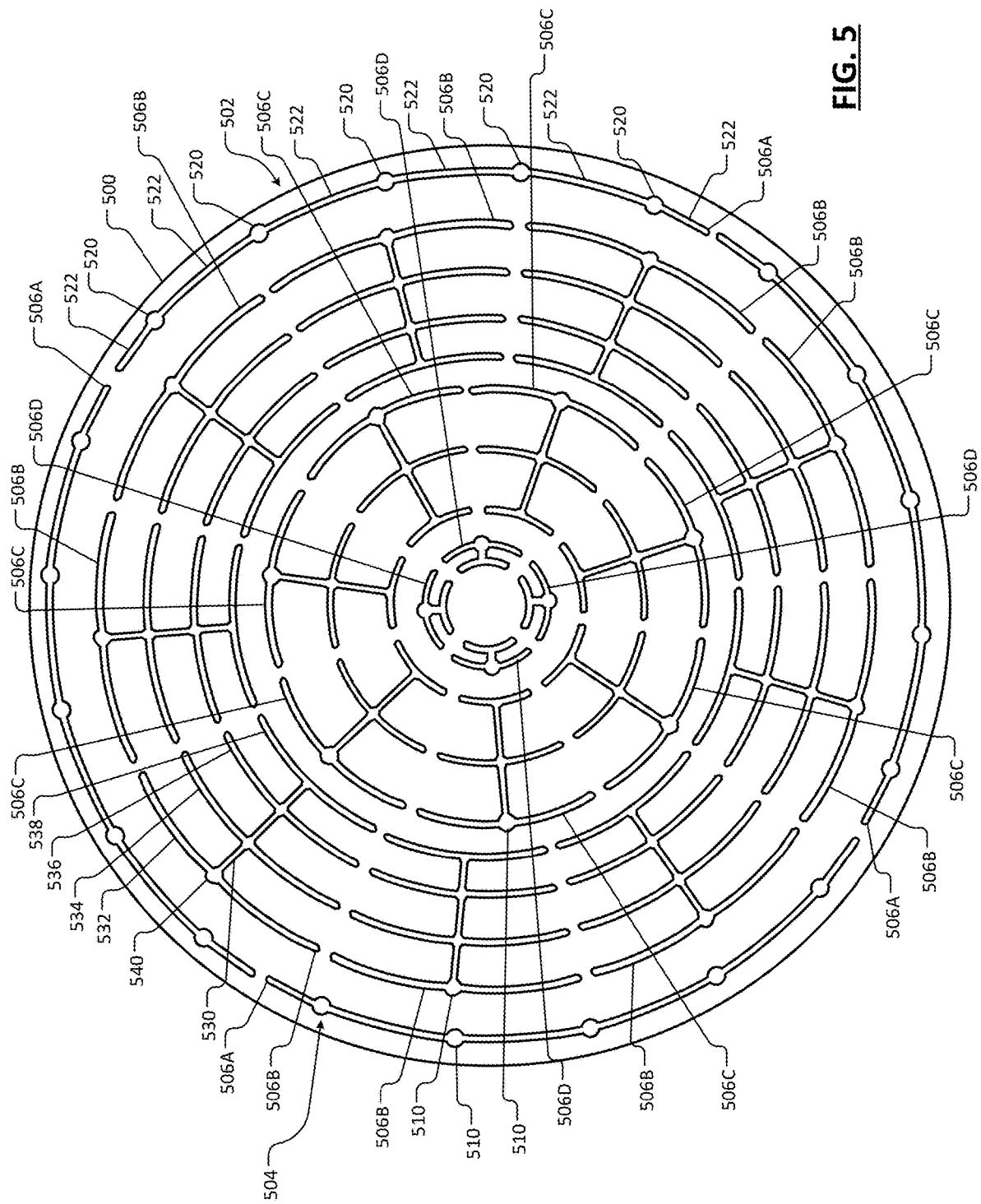
FIG. 5 a top view of an example of a monopolar clamping electrode having a clamping electrode pattern and a coolant gas groove opening pattern for four coolant gas zones including coolant gas groove openings with gas supply hole portions in accordance with an embodiment of the present disclosure.
Figure 6:
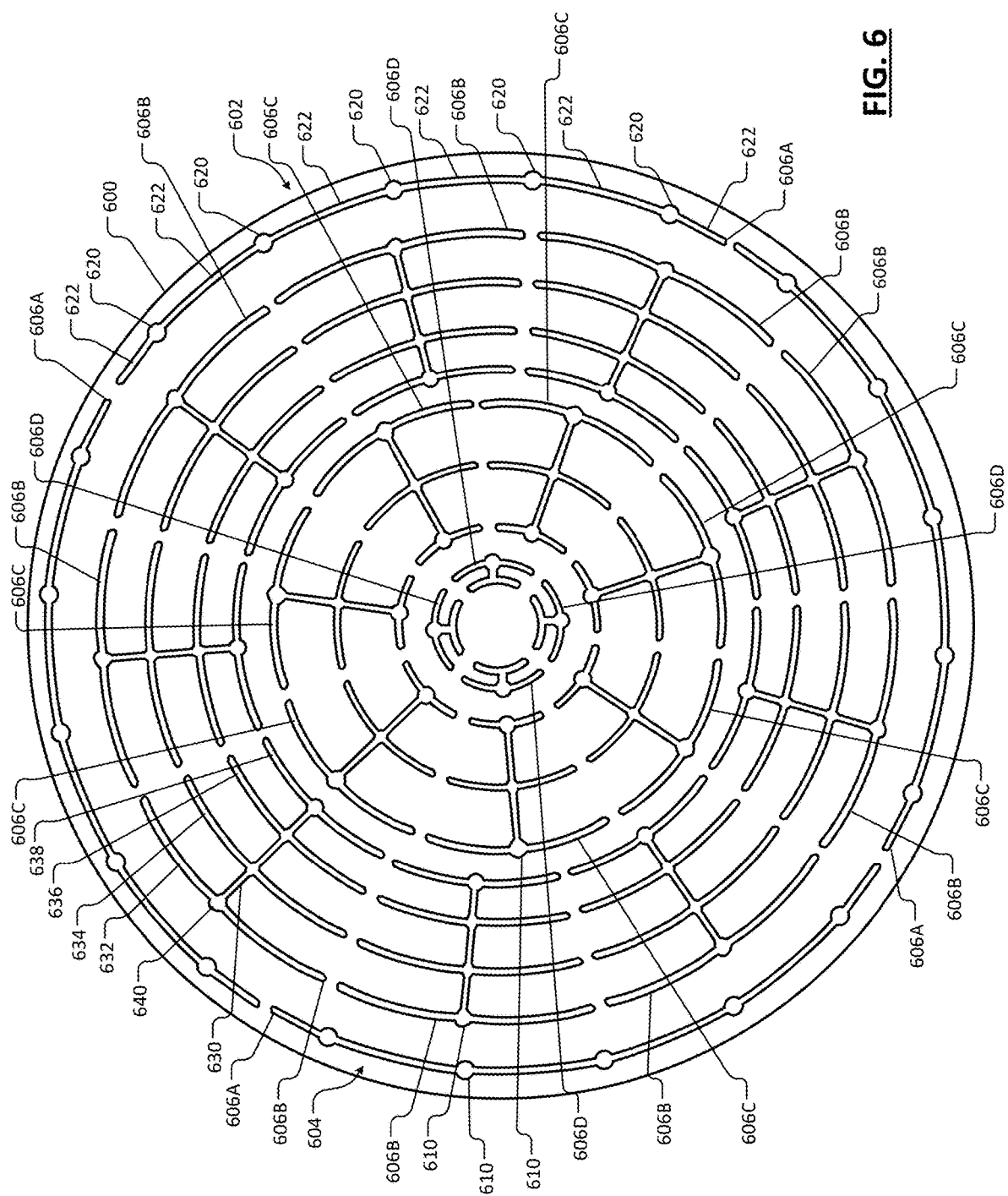
FIG. 6 is a top view of an example of a monopolar clamping electrode having a clamping electrode pattern and a coolant gas groove opening pattern for four coolant gas zones including coolant gas groove openings and gas supply and return hole portions in accordance with an embodiment of the present disclosure.

The top plate 202 may include a single monopolar electrode (herein after referred to as an electrode) with a corresponding clamping electrode pattern (an example of which is shown in FIGS. 5-6. The electrode has a coolant gas groove opening pattern, where an opening is provided for each coolant gas groove and corresponding supply hole and return hole of a corresponding top plate. The coolant gas groove opening pattern has a coolant gas groove opening that is larger than and mimics the shape of one or more coolant gas grooves and/or one of the corresponding coolant gas groove sets. This is further described below with respect to FIGS. 5-7.

The coolant gas groove sets of each sealed zone includes branches that are in series with branches in the other coolant gas groove sets of the same sealed zone. For example, the outer most branches of each of the coolant gas groove sets of the sealed zone 208B extend in series along a same circle (or circular path). Although the branches along a same circle (or circular path) may not be shown as having a same length, each of the branches that are along a same circle (or circular path) may have a same length, such that the corresponding radially extending grooves are each centered between two equal length branches. The branches of each coolant gas groove set is separated from adjacent ones of the coolant gas groove sets by circumferential gaps (e.g., gaps 250 between branches of coolant gas groove set 252 and branches of coolant gas groove set 254).

Each of the radially extending grooves of each of the sealed zones is staggered from the radially extending grooves of other ones of the sealed zones. This is unlike the radially extending grooves of the ESC of FIG. 3. None of the coolant gas grooves extend from one of the sealed zones to another one of the sealed zones. This aids in maintaining pressures and temperatures selected for each of the sealed zones.

Figure 3:
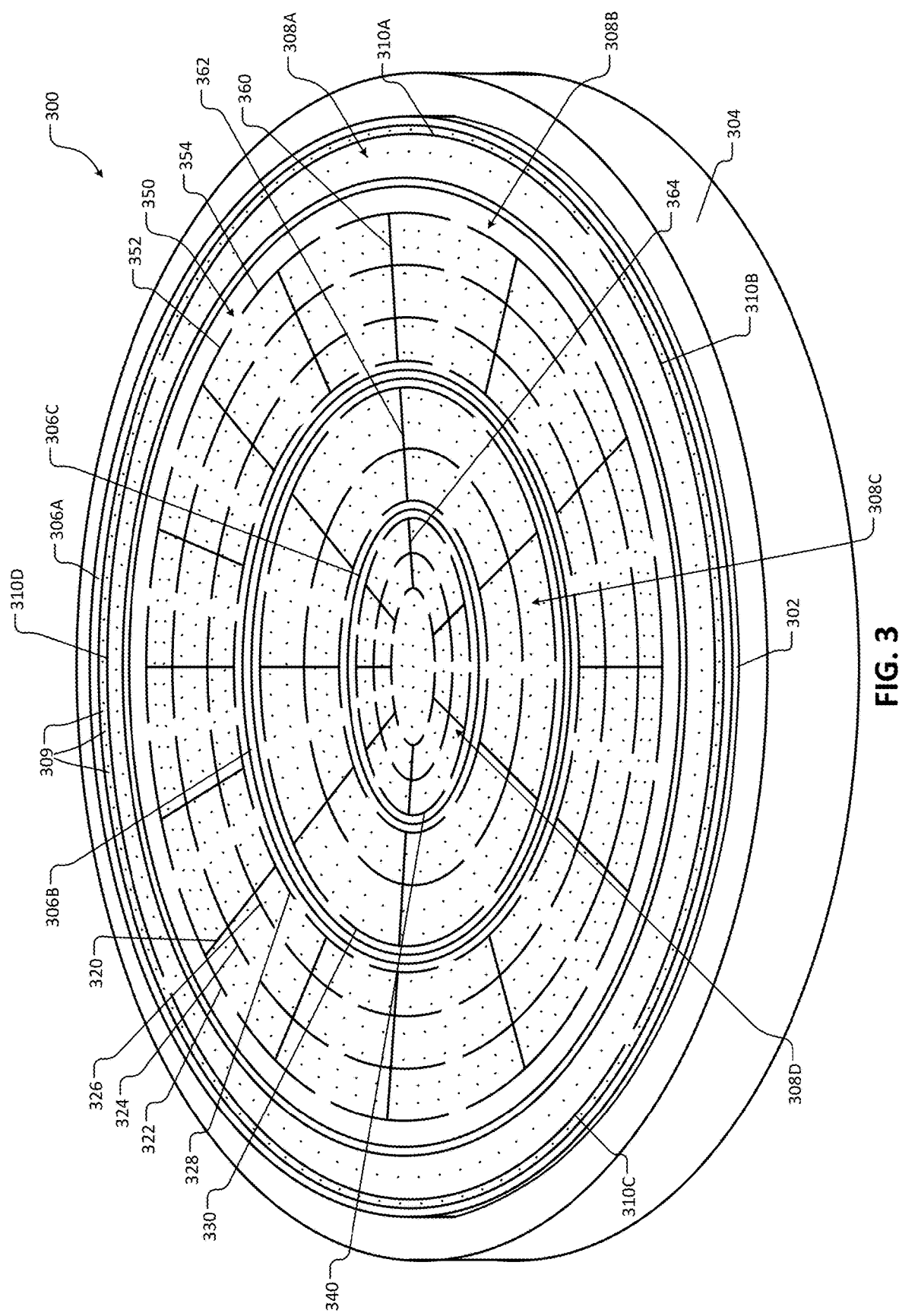
FIG. 3 is a perspective view of an example of another ESC incorporating four coolant gas zones with a coolant gas groove pattern having some radially aligned groove sets and a corresponding clamping electrode pattern in accordance with an embodiment of the present disclosure.

FIG. 3 shows an ESC 300 that includes a top plate 302 and a base plate 304. The top plate 302 may be bonded to the baseplate 304 via an intermediate layer (an example of which is shown in FIG. 1). The top plate 302 includes seals 306A, 306B, 306C, which separate sealed (or gas coolant)

zones 308A, 308B, 308C, 308D. The zones 308 are concentric. Each of the sealed zones 308 includes mesas 309. Although the ESC 300 is shown as having four coolant gas zones, the ESC 300 may have three or more coolant gas zones. An example, of an ESC having three zones is shown in FIG. 4. The seals 306 are annular-shaped and protrude upward from the top plate 302. The seals 306 may be formed of the same material as the top plate 302 and may be integrally formed as part of the top plate 302. The seals 306 may be concentric, as shown.

The radially outer most sealed zone 308A includes coolant gas grooves 310A, 310B, 310C, 310D that are in series and extend along a same circle (or circular path). The coolant gas grooves 310 may collectively be referred to as a single segmented groove that is circular shaped and has multiple gaps (non-groove areas). The single segmented groove may have any number of gaps and corresponding grooves. The coolant gas grooves 310 may each have any number of coolant gas supply holes through which coolant gas is supplied to the coolant gas grooves 310. An example of a gas supply hole is shown in FIG. 8.

Each of the sealed zones 308 includes multiple coolant gas groove sets, where each coolant gas groove set is tree-shaped and includes a radially extending groove and multiple pairs of annularly extending grooves (referred to as branch pairs). Each coolant gas groove set may have any number of branch pairs. In the example shown, the sealed zone 308B includes 9 coolant gas groove sets, the sealed zone 308C includes 7 coolant gas groove sets, and the radially inner most sealed zone 308D includes 4 coolant gas groove sets. As an example, a radially extending groove 320 and branches 322, 324, 326, 328 are identified for one of the coolant gas groove sets of the sealed zone 308B. One of the coolant gas groove sets of each of the sealed zones 308C, 308D are designated respectively 330, 340. The branches, in each of the branch pairs, oppose each other and extend in opposite directions away from a corresponding intersection, where the branches meet the corresponding one of the radially extending grooves.

In FIG. 3, the grooves of the coolant gas groove sets are shown as lines. In actuality, the grooves are shallow trenches that direct and distribute coolant gas uniformly throughout the sealed zones 308. Each of the grooves has a corresponding maximum depth and a corresponding maximum width, as described above with respect to the ESC of FIG. 2. As shown, the lengths of branches of each of the coolant gas groove sets decrease along the corresponding radially extending groove, such that the radially outer most branches are the longest and the radially inner most branches are the shortest.

As an example, each of the coolant gas groove sets of the sealed zones 308 may have one or more corresponding coolant gas supply holes. Each of the coolant gas groove sets may have one or more corresponding coolant gas return holes. In an embodiment, the coolant gas groove sets include coolant gas supply holes and not coolant gas return holes. In another embodiment, the coolant gas groove sets include coolant gas supply holes and coolant gas return holes. In another embodiment, each of the coolant gas groove sets includes only a single coolant gas supply hole and only one coolant gas return hole. The coolant gas supply hole may be located in a groove intersection at a radially outermost end of the corresponding radially extending groove. Each groove intersection is where a radially extending groove meets inner most ends of two branches. The coolant gas return hole may be (i) at a radially innermost end of the radially extending groove, (ii) in a groove of the corresponding coolant gas groove set and at a furthest point away from the coolant gas supply hole, or (iii) at a point therebetween.

The top plate 302 may include a single monopolar electrode (herein after referred to as an electrode) with a corresponding clamping electrode pattern (an example of which is shown in FIGS. 5-6. The electrode has a coolant gas groove opening pattern, where an opening is provided for each coolant gas groove and corresponding supply hole and return hole of a corresponding top plate. The coolant gas groove opening pattern has a coolant gas groove opening that is larger than and mimics the shape of one or more coolant gas grooves and/or one of the corresponding coolant gas groove sets. This is further described below with respect to FIGS. 5-7.

The coolant gas groove sets of each of the sealed zones 308 includes branches that are in series with branches in the other coolant gas groove sets of the same sealed zone. For example, the outer most branches of each of the coolant gas groove sets of the sealed zone 308B extend in series along a same circle (or circular path). Although the branches along a same circle (or circular path) may not be shown as having a same length, each of the branches that are along a same circle (or circular path) may have a same length, such that the corresponding radially extending grooves are each centered between two equal length branches. The branches of each coolant gas groove set is separated from adjacent ones of the coolant gas groove sets by circumferential gaps (e.g., gaps 350 between branches of coolant gas groove set 352 and branches of coolant gas groove set 354).

Some of the radially extending grooves of each of the sealed zones 308 are radially in alignment with other radially extending grooves of the other sealed zones 308. For example, the radially extending grooves 360, 362, 364 are in series and extend along a same linear line. The radially extending grooves are separated by the seals 306B, 306C. None of the coolant gas grooves extend from one of the sealed zones to another one of the sealed zones. This aids in maintaining pressures and temperatures selected for each of the sealed zones.

FIG. 4 shows an ESC 400 that includes a top plate 402 and a base plate 404. The top plate 402 may be bonded to the baseplate 404 via an intermediate layer (an example of which is shown in FIG. 1). The top plate 402 includes seals 406A, 406B, 406C, which separate sealed (or gas coolant) zones 408A, 408B, 408C. The zones 408 are concentric. Each of the sealed zones 408 includes mesas 409. Although the ESC 400 is shown as having three coolant gas zones, the ESC 400 may have three or more coolant gas zones. The seals 406 are annular-shaped and protrude upward from the top plate 402. The seals 406 may be formed of the same material as the top plate 402 and may be integrally formed as part of the top plate 402. The seals 406 may be concentric, as shown.

The radially outer most sealed zone 408A includes coolant gas grooves 410A, 410B, 410C, 410D that are in series and extend along a same circle (or circular path). The coolant gas grooves 410 extend along an outside of the seal 406B, unlike the coolant gas grooves 310 of FIG. 3, which extend along the inside of the seal 306A. The coolant gas grooves 410 may collectively be referred to as a single segmented groove that is circular shaped and has multiple gaps. The single segmented groove may have any number of gaps and corresponding grooves. The coolant gas grooves 410 may each have any number of coolant gas supply holes through which coolant gas is supplied to the coolant gas grooves 410. An example of a gas supply hole is shown in FIG. 8.

Each of the sealed zones 408 includes multiple coolant gas groove sets, where each coolant gas groove set is tree-shaped and includes a radially extending groove and multiple pairs of annularly extending grooves (referred to as branch pairs). Each coolant gas groove set may have any number of branch pairs. In the example shown, the sealed zone 408B includes 10 coolant gas groove sets and the sealed zone 408C includes 10 coolant gas groove sets. As an example, a radially extending groove 420 and branches 422, 424, 426, 428 are identified for one of the coolant gas groove sets of the sealed zone 408B. One of the coolant gas groove sets of the sealed zones 408C are designated 430. The branches, in each of the branch pairs, oppose each other and extend in opposite directions away from a corresponding intersection, where the branches meet the corresponding one of the radially extending grooves.

In FIG. 4, the grooves of the coolant gas groove sets are shown as lines. In actuality, the grooves are shallow trenches that direct and distribute coolant gas uniformly throughout the sealed zones 408. Each of the grooves has a corresponding maximum depth and a corresponding maximum width, as described above with respect to the ESC of FIG. 2. As shown, the lengths of branches of each of the coolant gas groove sets decrease along the corresponding radially extending groove, such that the radially outer most branches are the longest and the radially inner most branches are the shortest.

As an example, each of the coolant gas groove sets of the sealed zones 408 may have one or more corresponding coolant gas supply holes. Each of the coolant gas groove sets may have one or more corresponding coolant gas return holes. In an embodiment, the coolant gas groove sets include coolant gas supply holes and not coolant gas return holes. In another embodiment, the coolant gas groove sets include coolant gas supply holes and coolant gas return holes. In another embodiment, each of the coolant gas groove sets includes only a single coolant gas supply hole and only one coolant gas return hole. The coolant gas supply hole may be located in a groove intersection at a radially outermost end of the corresponding radially extending groove. Each groove intersection is where a radially extending groove meets inner most ends of two branches.

The top plate 402 may include a single monopolar electrode (herein after referred to as an electrode) with a corresponding clamping electrode pattern (an example of which is shown in FIGS. 5-6. The electrode has a coolant gas groove opening pattern, where an opening is provided for each coolant gas groove and corresponding supply hole and return hole of a corresponding top plate. The coolant gas groove opening pattern has a coolant gas groove opening that is larger than and mimics the shape of one or more coolant gas grooves and/or one of the corresponding coolant gas groove sets. This is further described below with respect to FIGS. 5-7.

The coolant gas groove sets of each of the sealed zones 408 includes branches that are in series with branches in the other coolant gas groove sets of the same sealed zone. For example, the outer most branches of each of the coolant gas groove sets of the sealed zone 408B extend in series along a same circle (or circular path). Although the branches along a same circle (or circular path) may not be shown as having a same length, each of the branches that are along a same circle (or circular path) may have a same length, such that the corresponding radially extending grooves are each centered between two equal length branches. The branches of each coolant gas groove set is separated from adjacent ones of the coolant gas groove sets by circumferential gaps (e.g., gaps 450 between branches of coolant gas groove set 452 and branches of coolant gas groove set 454).

Some of the radially extending grooves of each of the sealed zones 408 are radially in alignment with other radially extending grooves of the other sealed zones 408. For example, the radially extending grooves 420, 460, 462, 464 are in series and extend along a same linear line. In the example shown there are four other similar series of radially extending grooves that extend along respective linear lines. The radially extending grooves are separated by the seal 406B and a center area 470. None of the coolant gas grooves extend from one of the sealed zones to another one of the sealed zones. This aids in maintaining pressures and temperatures selected for each of the sealed zones.

FIG. 5 shows a monopolar clamping electrode 500 having a clamping electrode pattern 502 and coolant gas groove opening pattern 504. The patterns 502 and 504 are for four coolant gas zones, where each of the four coolant gas (or sealed) zones includes respective coolant gas openings 506A, 506B, 506C, 506D. The patterns 502 and 504 may be modified for three or more coolant gas zones. The coolant gas openings 506 have corresponding gas supply portions (some of which designated 510).

In an embodiment, the monopolar clamping electrode 500 is a conductive film layer that covers more than a predetermined percentage of a radial surface area of a top plate of an ESC. The clamping electrode pattern 502 of the monopolar clamping electrode 500 provides a unitary structure that when in use is at a single voltage potential. The clamping electrode pattern 502 provides improved clamping force across the top plate. In the example shown, the monopolar clamping electrode may receive power from the power source 180 of FIG. 1. The monopolar clamping electrode may be connected to a terminal, which may be connected to the power source 180.

Although a certain number of coolant gas openings are shown for each of the sealed zones of the corresponding top plate, any number of gas openings may be included for each of the sealed zones. Each of the coolant gas openings 506A have multiple gas supply hole portions and groove openings connected in series. For example, the gas supply hole portions and groove openings of one of the coolant gas openings 506A are designated 520 and 522. Although each of the coolant gas openings 506A is shown having five gas supply hole portions, the coolant gas openings 506A may have a different number of gas supply hole portions than shown. The gas supply hole portions correspond to multiple coolant gas supply holes in corresponding coolant gas grooves of a top plate. By having multiple coolant gas supply holes per coolant gas groove set in an outermost zone, coolant gas pressure is maintained near a perimeter of the top plate. This compensates for coolant gas leakage through a radially outermost seal (e.g., the seal 206A of FIG. 2) of the top plate.

Each of the coolant gas openings 506B, 506C, 506D has radially extending portions (one of which is designated 530) and branch pair portions (single branch portions extending from one side of the radially extending portion 530 are designated 532, 534, 536, 538). The radially extending portions and branch pair portions are beneath corresponding radially extending grooves and groove branch pairs of a top plate. The radially extending grooves are centered over the radially extending portions. The groove branch pair grooves are centered over the branch pair portions. The radially extending portion 530 has at a radially outermost end with a gas supply opening portion 540. As shown, the lengths of the branch pair portions decrease in length along the corresponding radially extending portions, such that the radially outer most branch portions are the longest and the radially inner most branch portions are the shortest.

The coolant gas groove opening pattern 504 of the monopolar clamping electrode 500 corresponds to a groove pattern similar to that of the ESC 200 of FIG. 2, except the portion of the monopolar clamping electrode 500 corresponding to a radially inner most coolant zone is different. The radially inner most coolant zone of the corresponding top plate has two branch pairs per coolant gas groove set (instead of three branch pairs per coolant gas groove set) and thus the monopolar clamping electrode 500 has two corresponding branch pair portions per coolant gas opening set.

FIG. 6 shows a monopolar clamping electrode 600 that has a clamping electrode pattern 600 and coolant gas groove opening pattern 602 for four coolant gas zones including coolant gas openings with gas supply and return portions. By having return holes corresponding to the return portions, coolant gas flow may be increased. The monopolar clamping electrode 600 is similar to the monopolar clamping electrode 500 of FIG. 5, except the monopolar clamping electrode 600 includes gas return portions for the coolant gas groove openings in the radially inner three zones.

The patterns 602 and 604 are for four coolant gas zones, where each of the four coolant gas (or sealed) zones includes respective coolant gas openings 606A, 606B, 606C, 606D. The coolant gas openings 606 have corresponding gas supply portions (some of which designated 610). In an embodiment, the monopolar clamping electrode 600 is a conductive film layer that covers more than a predetermined percentage of a radial surface area of a top plate of an ESC. The clamping electrode pattern 602 of the monopolar clamping electrode 600 provides a unitary structure that when in use is at a single voltage potential. The clamping electrode pattern 602 provides improved clamping force across the top plate.

Each of the coolant gas openings 606A have multiple gas supply hole portions and groove openings connected in series. For example, the gas supply hole portions and groove openings of one of the coolant gas openings 606A are designated 620 and 622. Although each of the coolant gas openings 606A is shown having five gas supply hole portions, the coolant gas openings 606A may have a different number of gas supply hole portions than shown. The gas supply hole portions correspond to multiple coolant gas supply holes in corresponding coolant gas grooves of a top plate. By having multiple coolant gas supply holes per coolant gas groove set in an outermost zone, coolant gas pressure is maintained near a perimeter of the top plate. This compensates for coolant gas leakage through a radially outermost seal (e.g., the seal 206A of FIG. 2) of the top plate.

Each of the coolant gas openings 606B, 606C, 606D has radially extending portions (one of which is designated 630) and branch pair portions (single branch portions extending from one side of the radially extending portion 630 are designated 632, 634, 636, 638). The radially extending portions and branch pair portions are beneath corresponding radially extending grooves and groove branch pairs of a top plate. The radially extending grooves are centered over the radially extending portions. The groove branch pair grooves are centered over the branch pair portions. The radially extending portion 630 has at a radially outermost end with a gas supply opening portion 640. As shown, the lengths of the branch pair portions decrease in length along the corresponding radially extending portions, such that the radially outer most branch portions are the longest and the radially inner most branch portions are the shortest.

The coolant gas groove opening pattern 604 of the monopolar clamping electrode 600 corresponds to a groove pattern similar to that of the ESC 200 of FIG. 2, except the portion of the monopolar clamping electrode 600 corresponding to a radially inner most coolant zone is different. The radially inner most coolant zone of the corresponding top plate has two branch pairs per coolant gas groove set (instead of three branch pairs per coolant gas groove set) and thus the monopolar clamping electrode 600 has two corresponding branch pair portions per coolant gas opening set.

Figure 7:
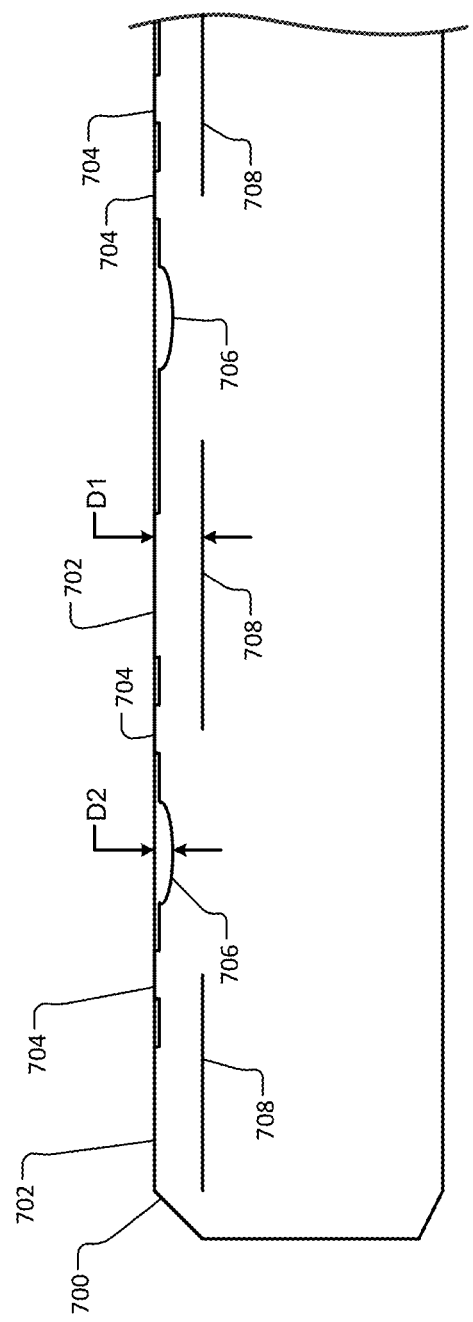
FIG. 7 is a cross-sectional side view of a portion of a top plate of an ESC illustrating seals, mesas, coolant grooves and a monopolar clamping electrode in accordance with an embodiment of the present disclosure.

FIG. 7 shows a portion 700 of a top plate of an ESC illustrating seals 702, mesas 704, coolant grooves 706 and a monopolar clamping electrode (portions 708 of which are shown). The portion 700 may be a portion of, for example, the top plate 202 of FIG. 2. The seals 702 may protrude upwards to a level above other portions of the top plate. Although the mesas 704 are shown as having a same height as the seals 702, the mesas 704 may have varying heights and may be shorter or taller than the seals 702. As an example, the heights of at least some of the mesas 704 may be 10μ. In one embodiment, the heights of the seals 702 and/or other seals of the top plate that are separating sealed zones may have heights equal to 0-100% of heights of surrounding surface features, such as the heights of the mesas 704.

The portions 708 of the monopolar clamping electrode are a predetermined distance away from the grooves 706. This prevents dielectric breakdown of the top plate 700 in areas between the portions 708 and the grooves 706. The coolant gas grooves 706 are examples of the coolant grooves disclosed herein and have a varying depth and width. A maximum of the depth is at a center of the groove. A maximum of the width (e.g., 300μ) is at a top of the groove. A depth D1 of the monopolar clamping electrode may be, for example, 300μ. A depth D2 of the coolant gas grooves 706 may be, for example, 100μ. Although the monopolar clamping electrode is shown having separated portions 708 in FIG. 7, the portions 708 are connected by other portions of the monopolar clamping electrode. In an embodiment, a plane extends radially through all of the portions of the monopolar clamping electrode.

FIG. 8 shows a portion 800 of an ESC that includes a top plate 852, an intermediate layer 854, and a baseplate 856. The baseplate 856 includes a gas channel 860 that directs a backside gas into a gas channel 862, which extends upwards from the gas channel 860 through the intermediate layer 854, through a coolant gas supply hole 863, and into a coolant gas groove 864. Although the coolant gas supply hole 863 is provided as an example of a coolant gas supply hole, coolant gas return holes described above may be configured similarly as the coolant gas supply hole 863 and have corresponding gas channels similar to the gas channels 860, 862. Portions 866 of a monopolar clamping electrode are also shown.

Figure 9:
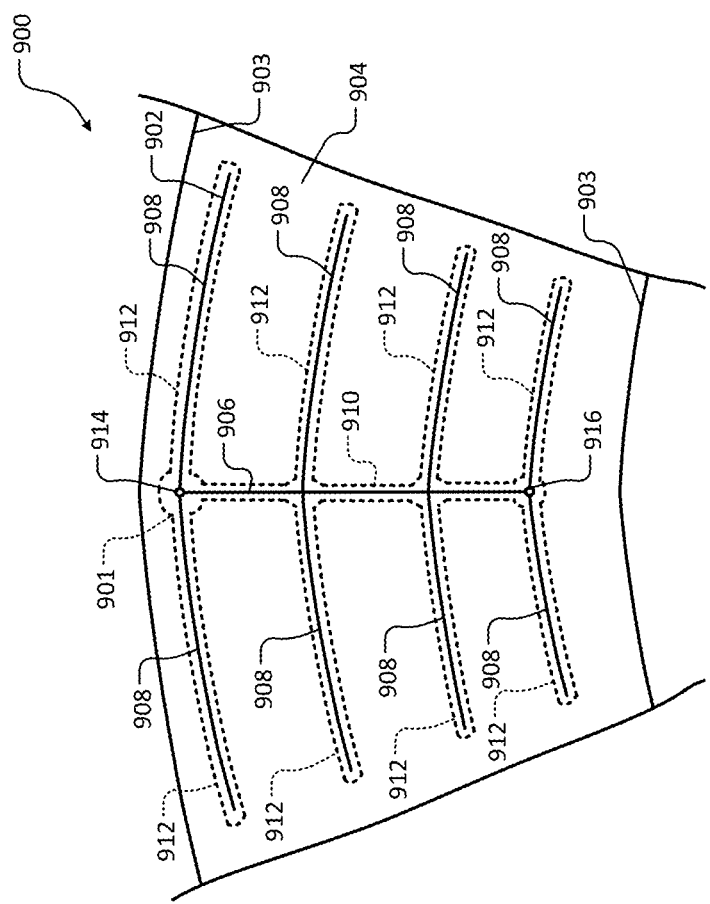
FIG. 9 is top view of an example portion of a sealed zone including a coolant gas groove opening set and a corresponding coolant gas groove set in accordance with an embodiment of the present disclosure.

FIG. 9 shows an example portion of a sealed zone including a coolant gas groove opening set 901 of a monopolar clamping electrode and a corresponding coolant gas groove set 902 disposed between seals 903 of a top plate 904 of an ESC. The sets 901, 902 are provided as examples to show relationships between branch pairs and branch opening pairs. Any of the grooves and/or groove openings disclosed herein may have similar relationships. The coolant gas groove opening set 901 includes radially extending groove 906 and annular extending grooves (or branch pairs) 908. The coolant gas groove set 902 includes radially extending groove opening 910 and annular extending groove openings (or branch opening pairs) 912. FIG. 9 also shows example coolant a gas supply hole 914 at a radially outermost end of the radially extending groove 906 and a gas return hole 916 at a radially innermost end of the radially extending groove 906. The coolant gas groove opening set 901 is below and a perimeter of which, as viewed from above, surrounds the coolant gas groove set 902 and the holes 914, 916. The coolant groove opening set 901 is at least a predetermined distance from the coolant gas groove set 902 and the holes 914, 916.

The above-described examples include electrode patterns and coolant gas groove patterns that are structured to provide improved electrostatic clamping and coolant gas distribution for multiple zones. The ESCs disclosed herein include multiple coolant gas zones that may be set at different coolant gas pressures (e.g., between 10 torr (T) to 80 T). The zones may include a center circular zone and multiple corresponding concentric zones. Each of the zones may have a predetermined number (e.g., 4 or more) of coolant gas supply holes, which may be in corresponding coolant gas grooves.

For multi-zone ESC, it can be important to have a sufficient supply of coolant gas across a zone and at each boundary (e.g., seal band) of the zone to minimize pressure influence from adjacent zones and make zonal (radial) temperature tuning efficient. The disclosed patterns facilitate providing this supply and corresponding distribution of coolant gas without dielectric material breakdown. Another benefit of the disclosed groove patterns is the ability to efficiently deliver coolant gas along an entire seal band, which reduces effect of temperature drift due to coolant gas leakage between zones. This is especially true as seal bands wear and become less efficient in separating the zones. The disclosed high conductance grooves aid in creating an isobaric condition in each zone. Heights of mesas and other structures can cause a high impedance to gas flow. The disclosed grooves compensate for this high impedance by increasing gas flow.

Placing an electrostatic clamp electrode below a coolant gas groove can create high electric fields across thin dielectric material and result in a light-up in the coolant gas groove and/or break down of the dielectric material between the electrostatic clamp electrode and the coolant gas groove. The disclosed examples do not include a clamp electrode directly under a coolant gas groove. Each of the clamp electrodes is in a layer of a top plate below a layer in which the coolant gas grooves are located and has openings directly under the coolant gas grooves. Material of the clamp electrodes is at least a predetermined distance away from the coolant gas grooves. Areas of the coolant gas openings are greater than areas of corresponding coolant gas grooves.

Thin top plates make it challenging and impractical to include multiple separate electrodes connected via underlying conductive bus layers. The disclosed examples include monopolar clamping electrodes that are each disposed in a single layer of respective ESC. The corresponding groove patterns aid in creating an isobaric condition for each annular zone, and have gaps where the clamp electrode resides in an internal dielectric layer. The distribution groove patterns may take on a variety of different patterns based on coolant gas pressures, coolant gas zone dimensions, etc. The use of more annular grooves per zone improves distribution. In an embodiment, the annular grooves within each zone include annular discontinuities (or gaps between adjacent grooves along a same circle). Within each set of annular grooves between two adjacent radial discontinuities (or seals) of a zone, the annular grooves are connected by a radial groove to create a branch pattern. The radial groove provides continuity within each branch pattern and improves coolant gas distribution. In an embodiment, each branch pattern includes at least one hole which is supplied coolant gas.

The disclosed patterns allow for the use of a monopolar clamping electrode for a thin top plate having few layers. It is not feasible to have multiple electrode layers interconnected by underlying conductive bus layers in a thin top plate having a thickness of, for example 1-1.25 mm and moderately thick green sheet construction (e.g., 0.3-0.8 mm). Green sheet construction refers to the stacking of layers of thin material (e.g., dielectric tape) and sintering the stack to form a plate. It is difficult to manufacture an underlying bus layer for this type of top plate, as there are inadequate layers for the bus layers. Also, the layers of a stack including multiple electrode layers can be too close to a top surface and break down through surrounding dielectric material. The disclosed discontinuous branched helium groove patterns provide uniform coolant gas distribution while providing a continuous monopolar clamping electrode (i.e., a monopolar clamping electrode that is not separated into multiple sections) disposed close to (within a predetermined distance of) a top surface of an ESC. The top surface is a surface exposed to the coolant gas existing between the top plate and a substrate. The top surface may face a backside surface of the substrate.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A top plate of an electrostatic chuck for a substrate processing system, the top plate bonded to a baseplate of the electrostatic chuck, the top plate comprising:
    a body of the top plate comprising a first zone and a second zone, wherein the second zone is arranged radially outside of the first zone;
    first coolant gas grooves disposed in the first zone; and
    second coolant gas grooves disposed in the second zone, wherein the second coolant gas grooves comprise a plurality of distinct sets of coolant gas grooves separated by gaps such that the plurality of distinct sets of coolant gas grooves are not fluidically coupled to each other, and wherein the second coolant gas grooves comprise
        a plurality of radially extending coolant gas grooves extending along respective radii of the body, and
        three or more coolant gas grooves that are not continuous and extend annularly away from one of the plurality of radially extending coolant gas groves and do not extend to fluidically couple another gas groove.

2. The top plate of claim 1, wherein the first coolant gas grooves and the second coolant gas grooves are separated by gaps such that the first coolant gas grooves are not fluidly coupled to the second coolant gas grooves.

3. The top plate of claim 1, wherein the first coolant gas grooves comprise a plurality of distinct sets of coolant gas grooves separated by gaps and not fluidly coupled to each other.

4. The top plate of claim 1, wherein one of the plurality of distinct sets of coolant gas grooves comprise the three or more coolant gas grooves and the plurality of radially extending coolant gas grooves.

5. The top plate of claim 1, wherein:
    the first coolant gas grooves comprise
        a plurality of annular extending coolant gas grooves, and
        a first radially extending coolant gas groove extending between and fluidly coupling the plurality of annular extending coolant gas grooves; and one of the plurality of radially extending coolant gas grooves extend between and fluidly coupling the three or more coolant gas grooves.

6. A top plate of an electrostatic chuck for a substrate processing system, the top plate bonded to a baseplate of the electrostatic chuck, the top plate comprising:
a body of the top plate comprising a first zone and a second zone, wherein the second zone is arranged radially outside of the first zone;
first coolant gas grooves disposed in the first zone; and
second coolant gas grooves disposed in the second zone, wherein the second coolant gas grooves comprise a plurality of distinct sets of coolant gas grooves separated by gaps such that the plurality of distinct sets of coolant gas grooves are not fluidically coupled to each other, and wherein at least one of the plurality of distinct sets of coolant gas grooves comprises
a radially extending coolant gas groove extending radially along a radius of the body, and
annular extending coolant gas grooves branching from the radially extending coolant gas groove, wherein the annular extending coolant gas grooves are not continuous.

7. The top plate of claim 6, wherein the first coolant gas grooves and the second coolant gas grooves are separated by gaps such that the first coolant gas grooves are not fluidly coupled to the second coolant gas grooves.

8. The top plate of claim 6, wherein the first coolant gas grooves comprise a plurality of distinct sets of coolant gas grooves, where adjacent ones of coolant gas grooves, which extend along a same circle and are included in the plurality of distinct sets of coolant gas grooves, are separated by gaps.

9. The top plate of claim 6, wherein adjacent ones of the second coolant gas grooves, which extend along a same circle are separated by gaps.

10. The top plate of claim 9, wherein one of the plurality of distinct sets of coolant gas grooves comprise the radially extending coolant gas groove and the annular extending coolant gas grooves.

11. The top plate of claim 6, wherein the first coolant gas grooves comprise:
a plurality of annular extending coolant gas grooves; and
another coolant gas groove extending radially between and fluidly coupling the plurality of annular extending coolant gas grooves.

12. A top plate of an electrostatic chuck for a substrate processing system, the top plate bonded to a baseplate of the electrostatic chuck, the top plate comprising:
a body of the top plate comprising a first zone and a second zone, wherein the second zone is arranged radially outside of the first zone;
first coolant gas grooves disposed in the first zone; and
a first plurality of distinct coolant gas groove sets disposed in the second zone and separated by gaps such that the first plurality of distinct coolant gas groove sets are not fluidly coupled to each other, wherein at least one of the first plurality of distinct coolant gas groove sets comprises
a radially extending coolant gas groove, and
a plurality of coolant gas grooves extending from the radially extending coolant gas groove, wherein each of the plurality of coolant gas grooves are not continuous.

13. The top plate of claim 12, wherein the first coolant gas grooves and the first plurality of distinct coolant gas groove sets are separated by gaps such that the first coolant gas grooves are not fluidly coupled to the first plurality of distinct coolant gas groove sets.

14. The top plate of claim 12, wherein the first coolant gas grooves comprise a second plurality of distinct sets of coolant gas grooves, where adjacent ones of coolant gas grooves, which extend along a same circle and are included in the second plurality of distinct sets of coolant gas grooves, are separated by gaps.

15. The top plate of claim 12, wherein the first coolant gas grooves comprise
a plurality of annular extending coolant gas grooves; and
a radially extending coolant gas groove extending between and fluidly coupling the plurality of annular extending coolant gas grooves of the first coolant gas grooves.

16. The top plate of claim 12, wherein the first zone and the second zone are concentric.

17. A top plate of an electrostatic chuck for a substrate processing system, the top plate bonded to a baseplate of the electrostatic chuck, the top plate comprising:
a body of the top plate comprising a first zone and a second zone, wherein the second zone is arranged radially outside of the first zone;
first coolant gas grooves disposed in the first zone, wherein the first coolant gas grooves comprise a plurality of distinct sets of coolant gas grooves separated by gaps such that the plurality of distinct sets of coolant gas grooves are not fluidically coupled to each other, and wherein at least one of the plurality of distinct sets of coolant gas grooves comprises
a radially extending coolant gas groove, and
three or more coolant gas grooves that are not continuous and extend from the radially extending coolant gas groove; and
second coolant gas grooves disposed in the second zone and comprising a plurality of annular extending coolant gas grooves.

18. The top plate of claim 17, wherein the first coolant gas grooves and the second coolant gas grooves are separated by gaps such that the first coolant gas grooves are not fluidly coupled to the second coolant gas grooves.

19. The top plate of claim 17, wherein the radially extending coolant gas groove extends between and couples the three or more coolant gas grooves disposed in the first zone.

20. The top plate of claim 17, wherein the second coolant gas grooves comprise a plurality of distinct sets of coolant gas grooves separated by gaps such that the plurality of distinct sets of coolant gas grooves are not fluidly coupled to each other.

21. The top plate of claim 20, wherein:
one of the plurality of distinct sets of coolant gas grooves comprises a radially extending coolant gas groove fluidically coupling the plurality of annular extending coolant gas grooves; and
the plurality of annular extending coolant gas grooves are not continuous.

22. The top plate of claim 17, wherein the first zone and the second zone are concentric.

* * * * *